(12) United States Patent
Min et al.

(10) Patent No.: US 9,655,229 B2
(45) Date of Patent: May 16, 2017

(54) CIRCUIT BOARD

(71) Applicant: Samsung Electro-Mechanics Co., Ltd., Suwon-si (KR)

(72) Inventors: Tae-Hong Min, Hwaseong (KR); Myung-Sam Kang, Hwaseong (KR); Young-Gwan Ko, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/938,900

(22) Filed: Nov. 12, 2015

(65) Prior Publication Data

US 2016/0143129 A1 May 19, 2016

(30) Foreign Application Priority Data

Nov. 13, 2014 (KR) ........................ 10-2014-0158270

(51) Int. Cl.
*H05K 1/02* (2006.01)
*H05K 1/11* (2006.01)
*H05K 1/18* (2006.01)
*H05K 3/46* (2006.01)
*H05K 3/44* (2006.01)

(52) U.S. Cl.
CPC ......... *H05K 1/0206* (2013.01); *H05K 1/0203* (2013.01); *H05K 1/0207* (2013.01); *H05K 1/0231* (2013.01); *H05K 3/4602* (2013.01); *H05K 3/4608* (2013.01); *H05K 1/185* (2013.01); *H05K 3/445* (2013.01); *H05K 2201/0323* (2013.01); *H05K 2201/09136* (2013.01); *H05K 2201/10015* (2013.01); *H05K 2201/10416* (2013.01); *H05K 2201/10636* (2013.01); *Y02P 70/611* (2015.11)

(58) Field of Classification Search
CPC .... H05K 1/0206; H05K 1/183; H05K 1/0298; H05K 1/115; H05K 1/021
USPC ........................................ 174/252
See application file for complete search history.

(56) References Cited

U.S. PATENT DOCUMENTS

| | | | | |
|---|---|---|---|---|
| 2007/0243402 A1* | 10/2007 | Sato | ........................ | H05K 3/386 428/606 |
| 2013/0010432 A1* | 1/2013 | Sundstrom | ........... | H05K 1/0207 361/748 |
| 2014/0110023 A1* | 4/2014 | Lim | ........................ | H05K 3/28 148/537 |
| 2015/0016079 A1* | 1/2015 | Furutani | ................ | H05K 1/185 361/763 |
| 2015/0261901 A1* | 9/2015 | Maitra | ................ | G06F 17/5022 716/132 |
| 2016/0197063 A1* | 7/2016 | Lin | ........................ | H01L 24/97 257/686 |

FOREIGN PATENT DOCUMENTS

| | | | |
|---|---|---|---|
| JP | 1999-284300 A1 | 10/1999 | |
| JP | 2000-349435 A1 | 12/2000 | |

\* cited by examiner

*Primary Examiner* — Timothy Thompson
*Assistant Examiner* — Charles Pizzuto
(74) *Attorney, Agent, or Firm* — NSIP Law

(57) ABSTRACT

A circuit board includes a first thermally conductive structure comprising a cavity or a recess portion. At least a portion of the first thermally conductive structure is inserted into an insulating part. An electronic device comprising a portion thereof inserted in the cavity or the recess portion.

18 Claims, 16 Drawing Sheets

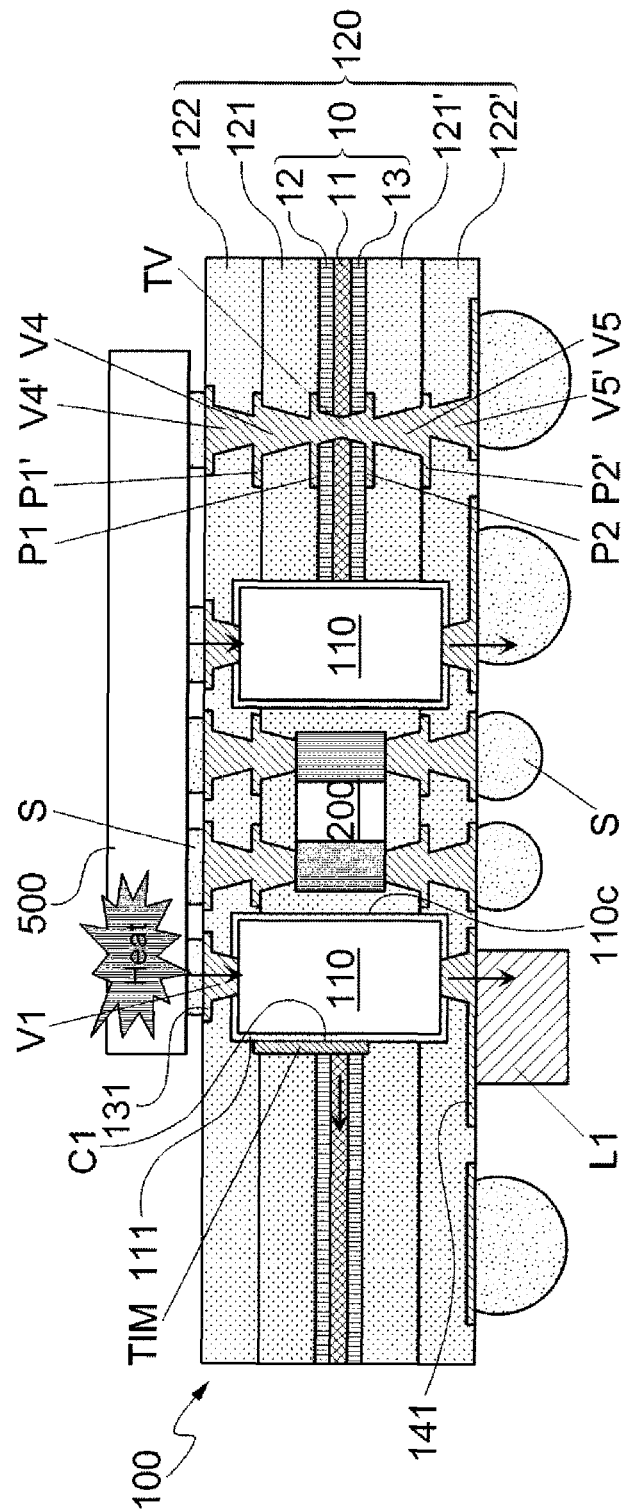

FIG. 3A
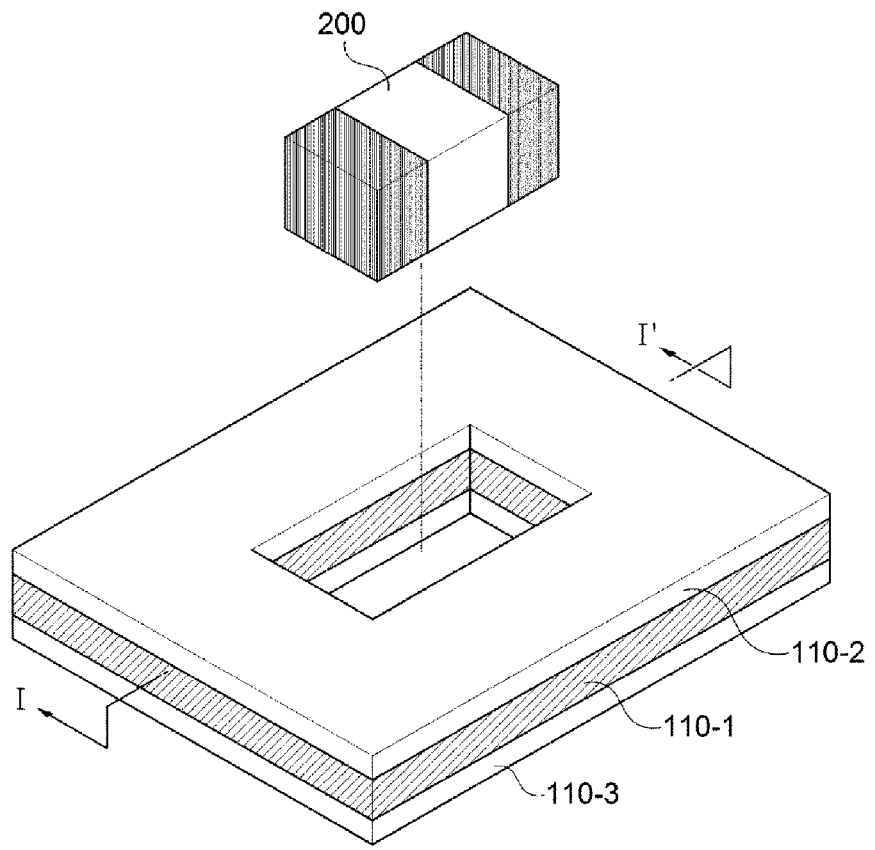
FIG. 3B
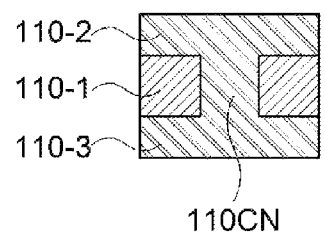
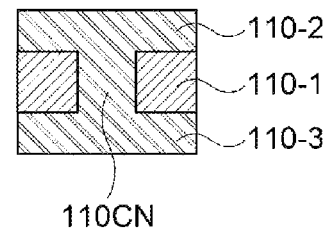

FIG. 12A
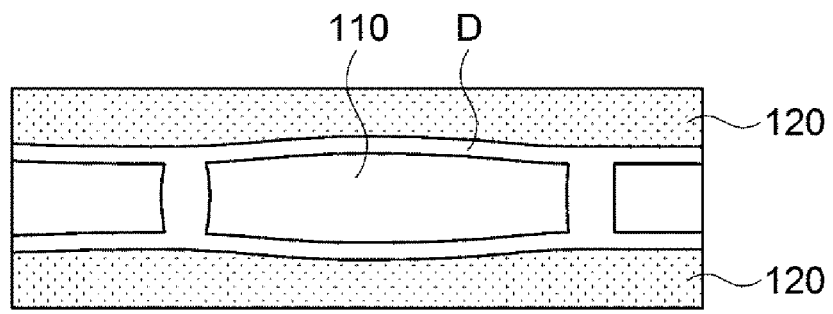
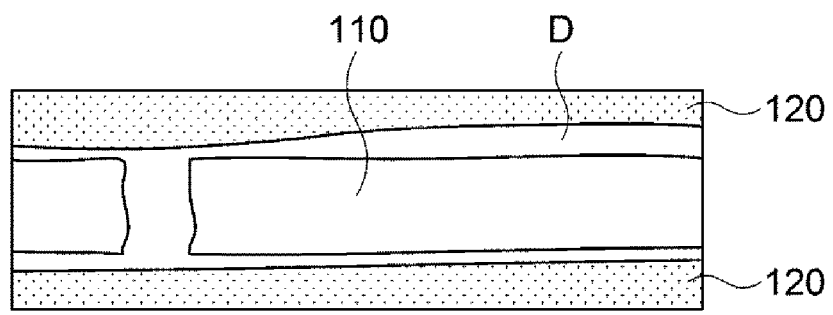
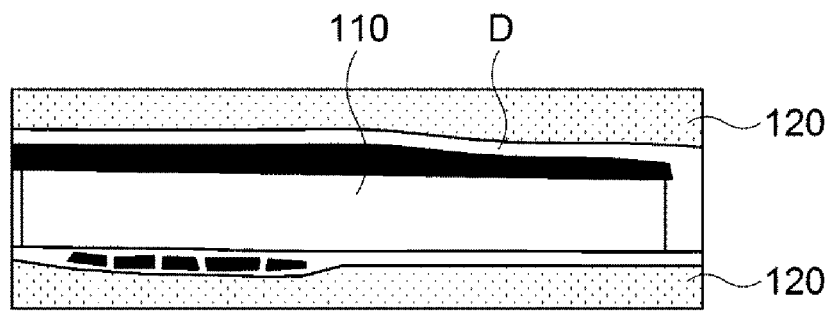

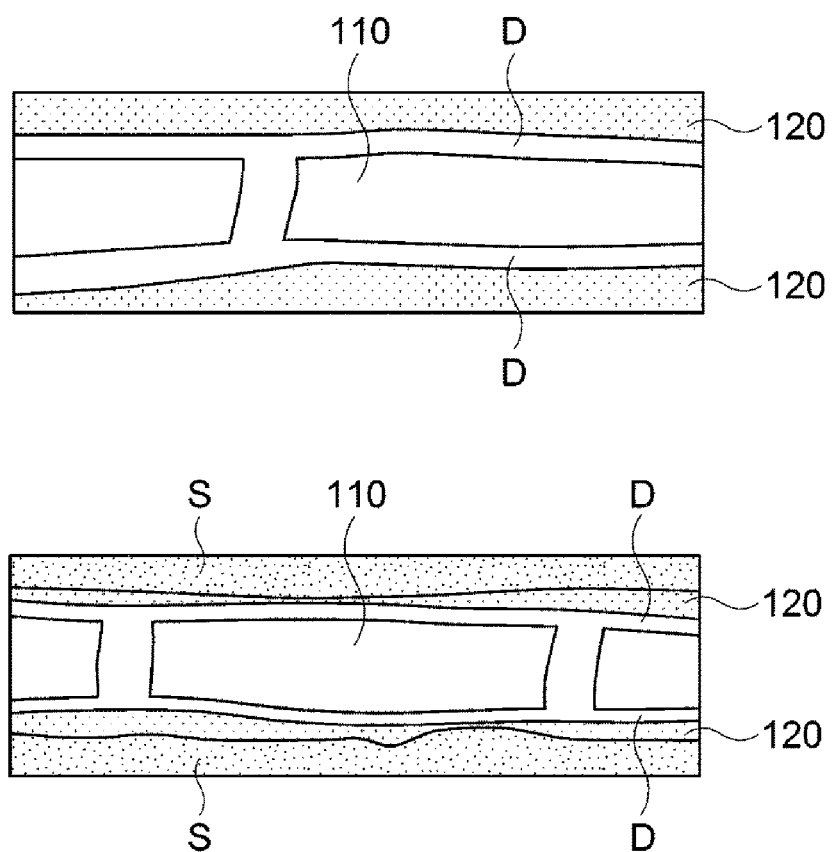

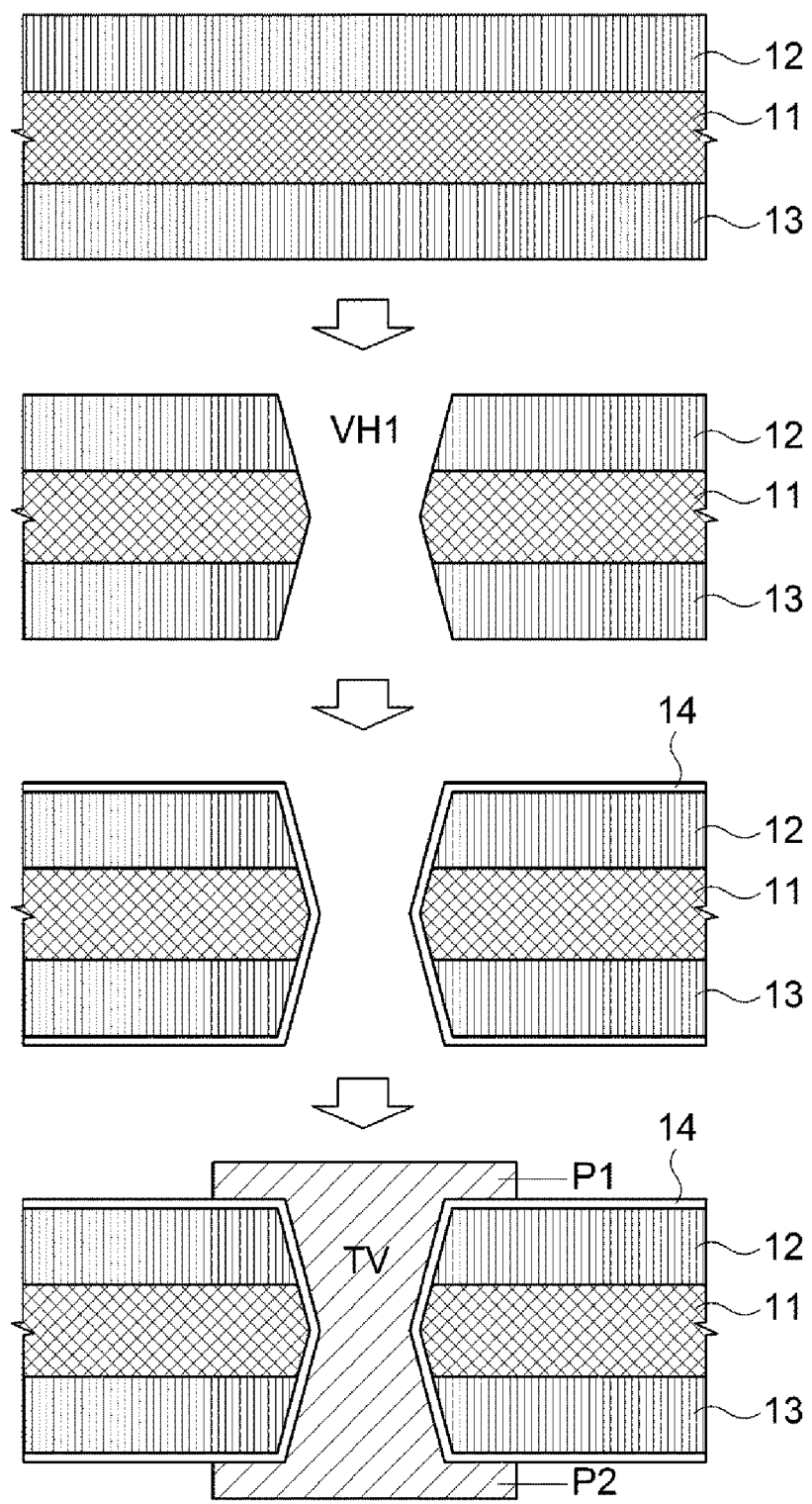

CIRCUIT BOARD

CROSS REFERENCE TO RELATED APPLICATION

This application claims the benefit under 35 USC §119(a) of Korean Patent Application No. 10-2014-0158270, filed on Nov. 13, 2014, the entire disclosure of which is incorporated by reference incorporated herein by reference for all purposes.

BACKGROUND

1. Field

The following description relates to a circuit board.

2. Description of Related Art

Multilayer circuit board technologies that form wiring layers in a circuit board, such as printed circuit boards, have been developed in response to demands for electronic devices with lighter weight, smaller sizes, faster speed, greater capabilities, and higher performance. Furthermore, multilayer circuit board technologies that mount electronic elements, such as active elements or passive elements, in the multilayer board have been also developed.

However, application processors with multi-functions and high performance that are connected to the multilayer board cause a significant increase in the heat of circuits of PCB.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A circuit board, including: a first thermally conductive structure including a cavity or a recess portion, wherein at least a portion of the first thermally conductive structure is inserted into an insulating part; and an electronic device including a portion thereof inserted in the cavity or the recess portion.

The circuit board may further include: a signal via including a surface in contact with the electronic device; and a heat distribution via including a surface in contact with the first thermally conductive structure.

The circuit board may further include: a first metal pattern configured to be in contact with the surface of the heat distribution via; and a second metal pattern configured to be in contact with the surface of the signal via, wherein heat flowing through the first metal pattern is greater than heat flowing through the second metal pattern.

A first electronic component may be mounted on the upper portion of the circuit board and the first electronic component may further include a first region and a second region. A temperature of the second region may increase more than a temperature of the first region during an operation of the first electronic component, and at least a portion of the second region may be connected with the first metal pattern using a joining portion.

The first electronic component may be mounted on the upper portion of the circuit board and at least a portion of the first thermally conductive structure may be positioned as a vertically downward region from the first electronic component.

At least a portion of the electronic device may be positioned in a vertically downward region from the first electronic component.

The circuit board may further include: an adhesion improving portion on the surface of the first thermally conductive structure configured to increase adhesion between the first thermally conductive structure and the insulating part.

The adhesion improving portion may include a primer including acrylic silane.

The circuit board may further include: a first via including a surface in contact with an upper surface of the first thermally conductive structure; a first metal pattern configured to be in contact with another surface of the first via; a second via including a surface in contact with a lower surface of the first thermally conductive structure; a second metal pattern configured to be in contact with another surface of the second via; a third via including a surface in contact with an upper surface of the electronic device; a third metal pattern configured to be in contact with another surface of the third via; a fourth via including a surface in contact with a lower surface of the electronic device; and a fourth metal pattern configured to be in contact with another surface of the fourth via, wherein the first thermally conductive structure may further include a hexahedron form with the upper surface and the lower surface thereof.

A first joining portion may be in contact with the first metal pattern and the first electronic component is in contact with the first joining portion.

A second joining portion may be in contact with the second metal pattern and an additive substrate is in contact with the second joining portion, and wherein heat generated from the first electronic component may be transmitted to the additive substrate through the first joining portion, the first metal pattern, the first via, the first thermally conductive structure, the second via, the second metal pattern, and the second joining portion.

The second joining portion may be operatively connected on the upper surface of a heat sink, wherein the upper surface and the lower surface of the heat sink may be exposed through the additive substrate, and wherein the additive substrate may further include a thermally conductive material.

The first electronic component may further include a first region and a second region of which clock speed is greater than that of the first region, wherein a distance from the second region to the first joining portion is shorter than that from the first region to the first joining portion.

In accordance with an embodiment, there is provided a circuit board, including: a first thermally conductive structure including a cavity or a recess portion, wherein at least a portion of the first thermally conductive structure is inserted into an insulating part, a first structure layer including a via hole, and a second structure layer integrated on an upper surface of the first structure layer and a lower surface of the first structure layer by filling a material inside the via hole.

The first structure layer may further include invar and the second structure layer may further include copper.

The first structure layer may further include graphite or graphene.

In accordance with another embodiment, there is provided a circuit board, including: a first insulating layer including a first cavity; a first thermally conductive structure including a second cavity, wherein a portion of the second cavity is inserted into the first cavity; an electronic device including a portion inserted into the second cavity; a second insulating layer configured to cover an upper portion of the first insulating layer, the first thermally conductive structure, and the electronic device; a third insulating layer configured to cover a lower portion of the first insulating layer, the first thermally conductive structure, and the electronic device; a first via including an end in contact with the first thermally conductive structure by passing through the second insulating layer; a second via including an end in contact with the first thermally conductive structure by passing through the third insulating layer; a third via including an end in contact with the electronic device by passing through the second insulating layer; and a fourth via including an end in contact with the electronic device by passing through the third insulating layer.

A first electronic component may be formed on the upper portion of the circuit board and at least a portion of the electronic device is positioned at a vertically downward region of the first electronic component.

The electronic device may be a decoupling capacitor and the third via may be operatively connected to a power source terminal of the first electronic component.

The first electronic component may further include a first region and a second region, wherein a temperature in the second region is higher than a temperature of the first region during an operation of the first electronic component, and wherein a metal pattern may be in contact with a joining portion, which is in contact with at least a portion of the second region, and may be in contact with another end of the first via.

Other features and aspects will be apparent from the following detailed description, the drawings, and the claims.

BRIEF DESCRIPTION OF THE DRAWINGS

FIG. 2 is a sectional view schematically illustrating a circuit board, according to another embodiment.

FIG. 3A is a perspective view schematically illustrating a first thermally conductive structure and a second electronic component, in accordance with an embodiment.

FIG. 3B is a cross-sectional view of FIG. 3A.

FIG. 12A is a schematic view illustrating a reflow test result of an insulating part directly contacted with a thermally conductive structure, in accordance with an embodiment.

FIG. 12B is a schematic view illustrating a solder pot test result of an insulating part directly contacted with a thermally conductive structure, in accordance with an embodiment.

FIG. 15 illustrates a process for treating a core part, according to an embodiment.

Figure 1:
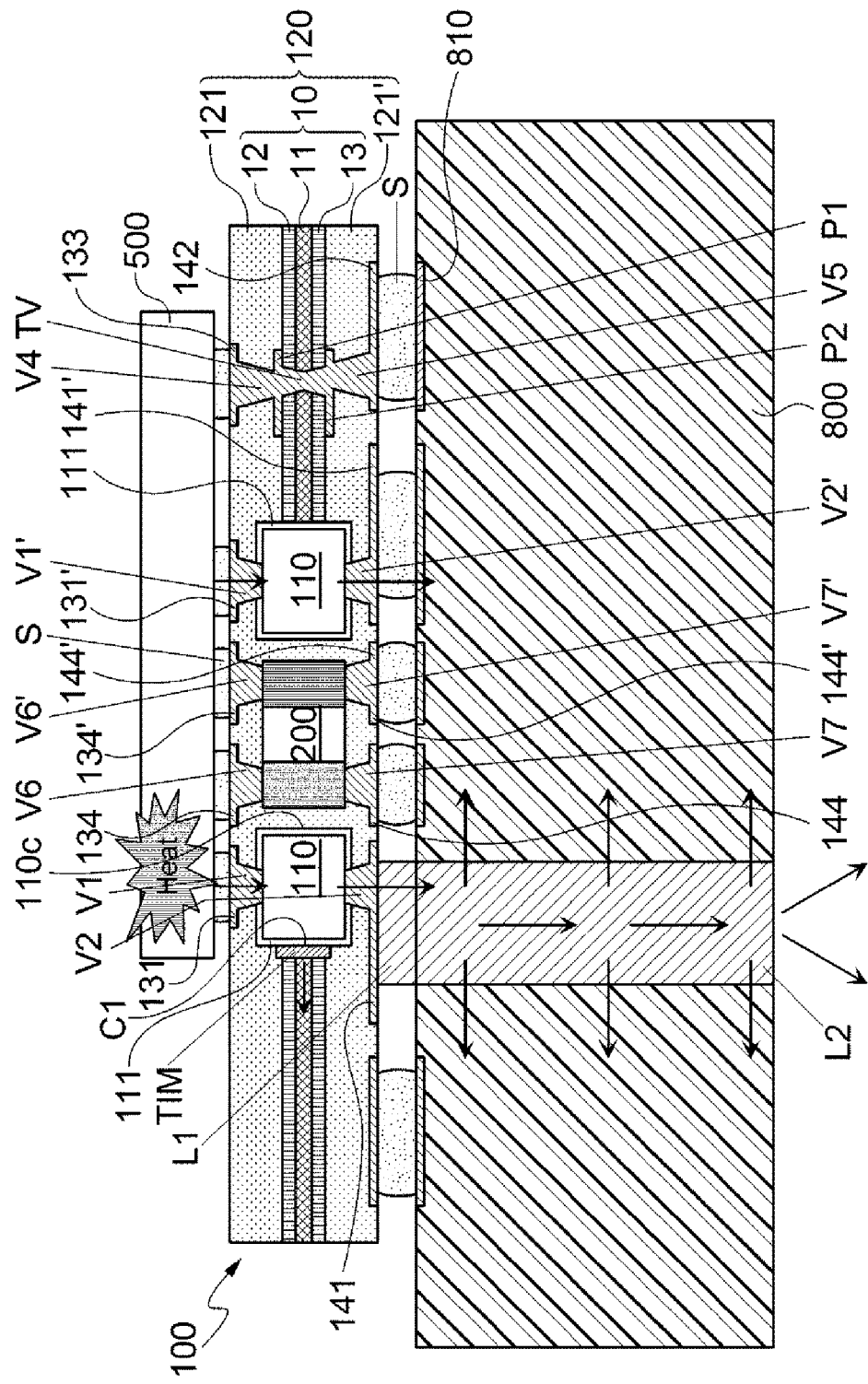
FIG. 1 is a sectional view schematically illustrating a circuit board, according to an embodiment.

Throughout the drawings and the detailed description, unless otherwise described or provided, the same drawing reference numerals refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations is described as an example; the sequence of operations is not limited to that set forth herein and may be changed as is known in the art, with the exception of steps and/or operations that necessarily occur in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure is thorough, complete, and conveys the full scope of the disclosure to one of ordinary skill in the art.

It will be understood that when an element or layer is referred to as being "on" or "connected to" another element or layer, it can be directly on or connected to the other element or layer or through intervening elements or layers may be present. In contrast, when an element is referred to as being "directly on" or "directly connected to" another element or layer, there are no intervening elements or layers present. Like reference numerals refer to like elements throughout. As used herein, the term "and/or" includes any and all combinations of one or more of the associated listed items.

FIG. 1 is a sectional view schematically illustrating a circuit board 100, according to an embodiment.

A circuit board 100, according to an embodiment, includes a first thermally conductive structure 110. At least a portion of the first thermally conductive structure 110 is inserted to an insulating part 120. The first thermally conductive structure 110 is formed of a material having high thermal conductivity. The first thermally conductive structure 110 is formed of a lump shape. In an embodiment, the first thermally conductive structure 110 is also formed in a cylindrical or polyprismatic shape. The first thermally conductive structure 110 is composed of a metallic material such as Cu. In another embodiment, the first thermally conductive structure 110 is composed of a non-metallic material having high thermal conductivity such as graphite, graphene, and other similar carbons or elements.

In an embodiment, a cavity 110c, which passes through from one surface to the other surface of the first thermally conductive structure, is formed in the first thermally conductive structure. In another embodiment, a recess portion (not shown) which is caved in, but does not pass through from one surface to the other surface of the first thermally conductive structure, is formed in the first thermally conductive structure 110.

At least a portion of a second electronic component 200 is inserted in the cavity 110c or the recess portion. In one example, the second electronic component 200 is an active element, such as IC (integrated circuit), or a passive element, such as a capacitor or an inductor. In one illustrative example, the second electronic component 200 is an electronic device.

Figure 3C:
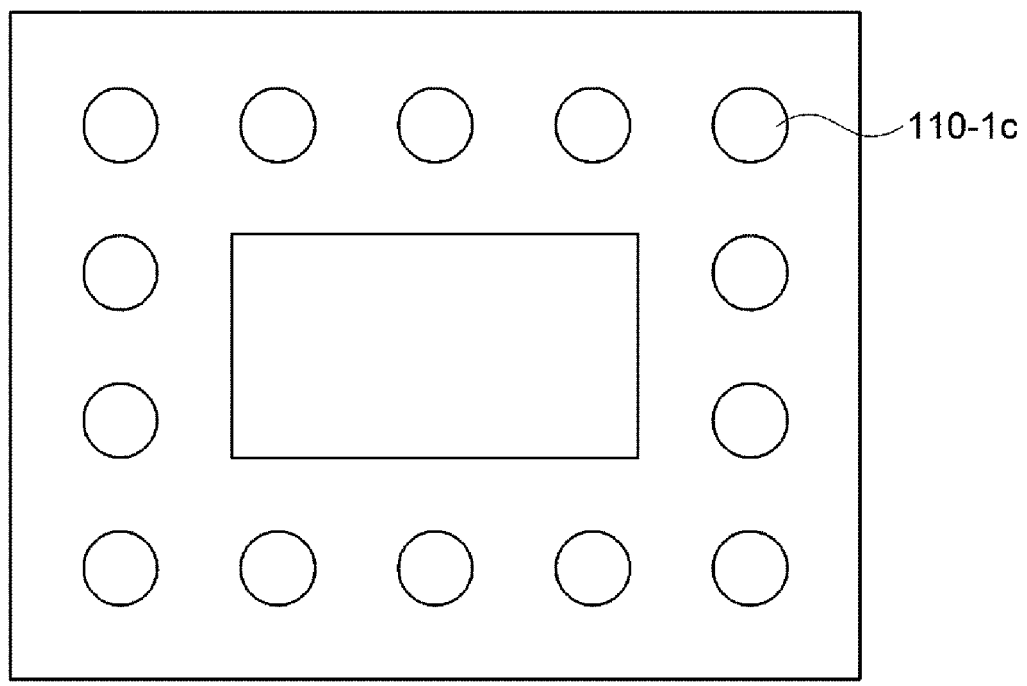
FIG. 3C schematically illustrates a flat shape of a first structure layer, in accordance with an embodiment.

Referring to FIGS. 3A through 3C, the first thermally conductive structure 110 includes a first structure layer 110-1, a second structure layer 110-2, and a third structure layer 110-3. In one illustrative example, the second structure layer 110-2 is formed on the upper surface of the first structure layer 110-1. The third structure layer 110-3 is formed on the lower surface of the first structure layer 110-1. A via hole 110-1c is formed in the first structure layer 110-1. In one illustrative example, the second structure layer 110-2 and the third structure layer 110-3 are composed of the same material and this material is filled inside the via hole 110-1c so that the second structure layer 110-2, a connecting portion 110CN and the third structure layer 110-3, is integrated. Accordingly, the second structure layer 110-2 and the third structure layer 110-3 are securely fixed to the first structure layer 110-1. In another illustrative example, the materials forming the second structure layer 110-2 and the third structure layer 110-3 may be formed of materials with different or slightly different material characteristics, while still ensuring that both the second structure layer 110-2 and the third structure layer 110-3 are securely fixed to the first structure layer 110-1.

In an embodiment, the first structure layer 110-1 is composed of a material having high rigidity, such as invar, and the second structure layer 110-2 and the third structure layer 110-3 is composed of copper. Thus, the first thermally conductive structure 110 effectively reduces problems caused due to warpage and alleviates heat problems, such as hot spots.

In another embodiment, the first structure layer 110-1 is composed of a material having very high thermal conductivity, such as graphite or graphene. Because graphite or graphene has very high thermal conductivity in a XY direction, the graphite or the graphene may be arranged in a desired direction for optimal thermal conduction. For example, when heat is distributed in a horizontal direction using the graphite or the graphene, either the graphite or the graphene may cause delamination a vertical direction because the graphite or the graphene has weak interlayer bonding. However, as described above, delamination is reduced by fixing the graphite or the graphene with the second structure 110-2 and the third structure 110-3.

In an embodiment, the insulating part 120 includes one insulating layer or more than one insulating layer. FIG. 1 illustrates the insulating part 120 including three insulating layers 10, 121, 121' in which the insulating layer 10 at a center or a relative center of the insulating portion 120 is a core part 10. However, the insulating portion 120 is not limited to this configuration and alternative configurations may be used for the three insulating layers 10, 121, 121'.

In an embodiment, the first thermally conductive structure 110 is positioned at the center of the insulating part 120. When the core part 10 is formed as shown, a first cavity C1, which passes through the core part 10, is formed and the first thermally conductive structure 110 is inserted inside the first cavity C1.

In an embodiment, a via, which is formed in the insulating part 120, is in contact with first thermally conductive structure 110. Hereinafter, the via located on the upper portion of the first thermally conductive structure 110 is referred to as a first via V1 and the via located on the lower portion is referred to as a second via V2. At least one metal pattern is formed on the insulating part 120. Also, the metal pattern, which is in contact with the first via V1, is referred to as a first metal pattern 131 and the metal pattern, which is in contact with the second via V2, is referred to as a second metal pattern 141. A fourth via V4 and a fifth via V5 may be also formed on the insulating part 120. Furthermore, the metal pattern, which is in contact with one end of the fourth via V4, is referred to as a third metal pattern 133 and the metal pattern, which is in contact with the other end of the fifth via V5, is referred to as the fourth metal pattern 142.

In an embodiment, the first thermally conductive structure 110 absorbs heat. The larger a volume of the first thermally conductive structure 110, the greater a function of the first thermally conductive structure 110. As shown in FIG. 1, the first thermally conductive structure 110 is formed in a column shape. Volume of the first thermally conductive structure 110 is maximized when the lower areas of the columns of the first thermally conductive structure 110 are equal. When the upper portion and the lower portion of the first thermally conductive structure 110 are formed in a polygon shape, particularly in a square shape, the first thermally conductive structure 110 is configured to be smaller in size and include a finer pattern pitch, compared to when the upper portion and the lower portion of the first thermally conductive structure 110 are formed in a round or oval shape. Volume of the first thermally conductive structure 110 is much larger than that of vias such as the first via V1 to the seventh via V7 so that a plurality of vias are in contact with the surface of the first thermally conductive structure 110, particularly the upper surface or the lower surface. That is, areas of the upper surface and the lower surface of the first thermally conductive structure 110 are larger than that areas of vias. Further, volumes of the upper surface and the lower surface of the first thermally conductive structure 110 are also twice as large as the volumes of vias. Thus, the first thermally conductive structure 110 is configured to absorb heat rapidly from a heat source and disperse the heat through other paths that are connected to the first thermally conductive structure 110. A distance between the first thermally conductive structure 110 and a hot spot decreases to further shorten the transferring time of heat from the hot spot to the first thermally conductive structure 110, as the thickness of the first thermally conductive structure 110 increases.

In an embodiment, a first electronic component 500 is formed on one surface of a circuit board 100. The circuit board 100 is formed on one surface of an additive substrate 800, such as a main board. The first electronic component 500 is an electronic component, such as an application processor (AP), and generates heat during operation.

Heat is generated as the first electronic component 500 operates. A region may exist in the first electronic component 500 with high temperature, which is referred to as a hot spot. The hot spot is formed at a certain area in the circuit board 100, for example, throughout an entire area of or a portion of the first electronic component 500. The hot spot is also formed at a relatively dense region, such as near a power terminal or a switch of the first electronic component 500.

The first electronic component 500 includes both a region with relatively high performance and a region with relatively low performance. For example, a processor connected with cores with a clock speed of 1.8 GHz and a processor connected with cores with a clock speed of 1.2 GHz are mounted in the first electronic component 500 in different regions, respectively.

Figure 4:
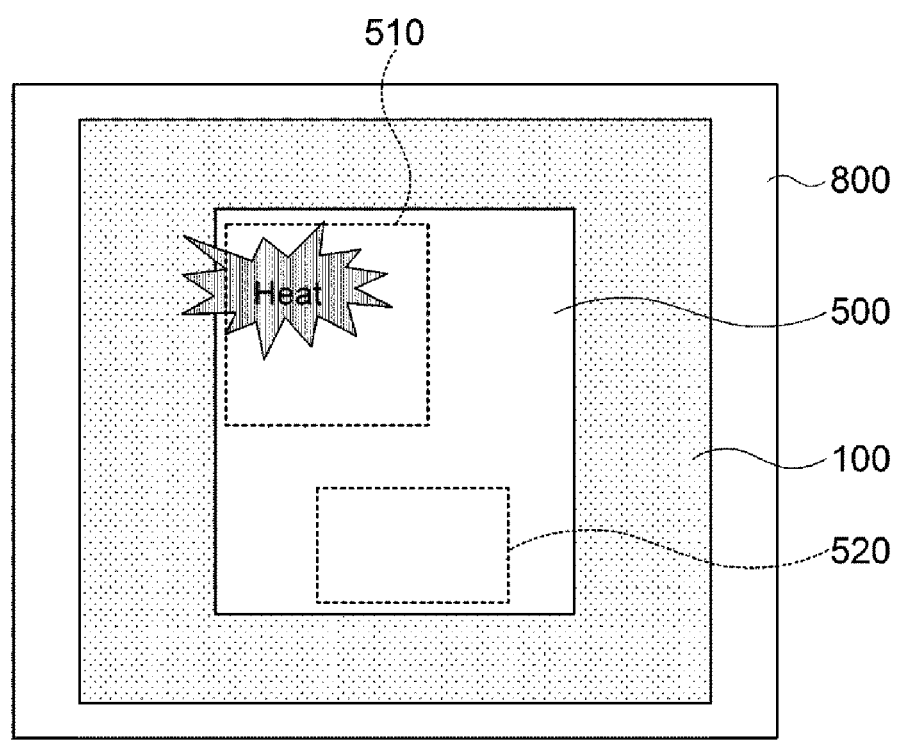
FIG. 4 is a schematic view illustrating a flat shape of a circuit board, according to an embodiment.
Figure 5:
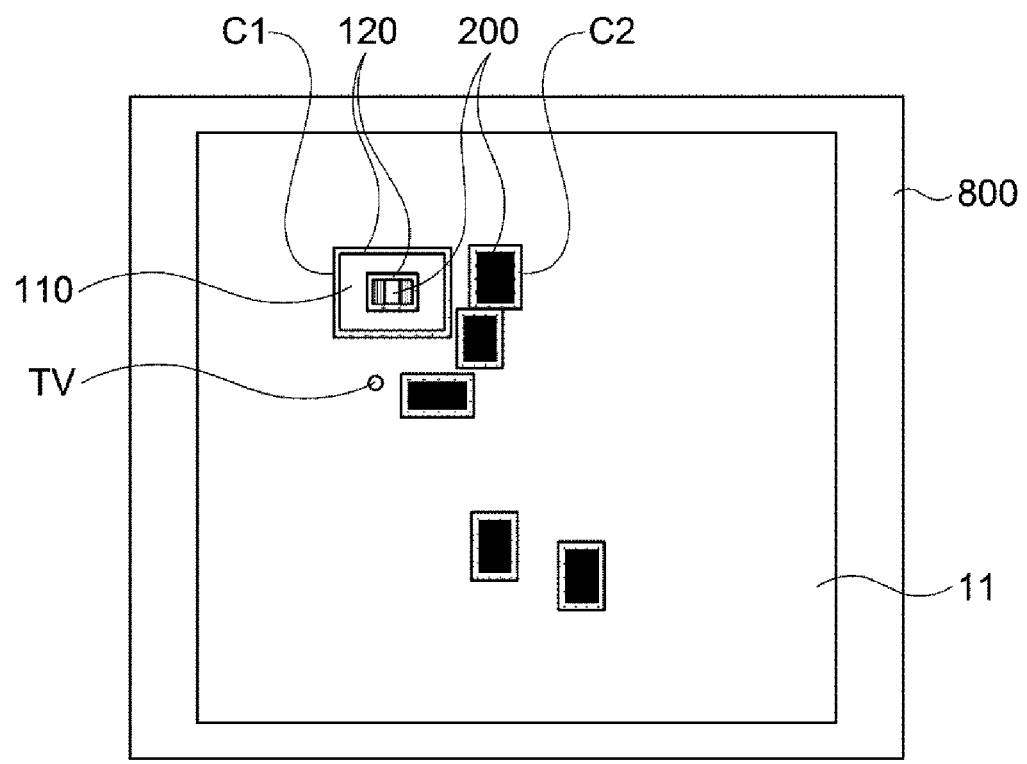
FIG. 5 is a horizontal sectional view schematically illustrating a circuit board, according to an embodiment.
Figure 6:
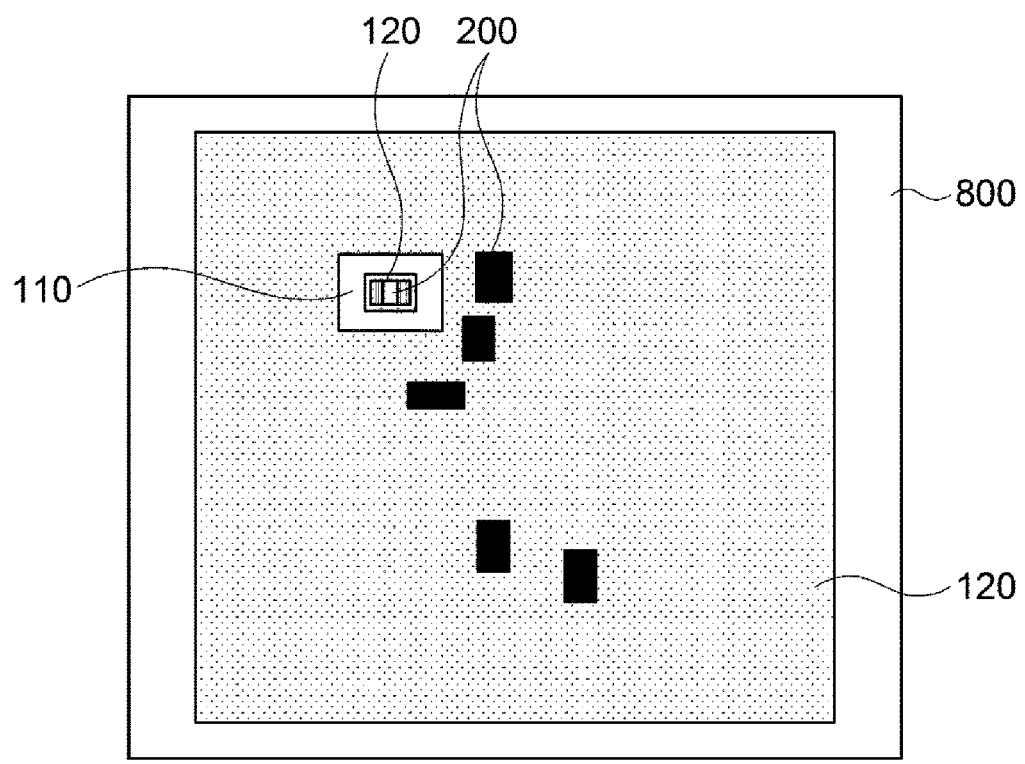
FIG. 6 is a horizontal sectional view schematically illustrating a circuit board, according to another embodiment.

FIG. 4 is a schematic view illustrating a flat shape of a circuit board, according to an embodiment of the present disclosure. Referring to FIG. 4, in an embodiment, the first electronic component 500 includes a first unit area 510 and a second unit area 520. The first unit area 510 operates faster than the second unit area 520. Thus, the first unit area 510 uses more power and generates more heat than the second unit area 520.

In the circuit board 100, according to an embodiment, the first thermally conductive structure 110 is positioned at an area adjacent to a hot spot. Thus, the heat generated from the hot spot is rapidly distributed to other regions of the circuit board 100 or to other devices, such as a main board, to which the circuit board 100 is connected.

In an embodiment, at least a portion of the first thermally conductive structure 110 is positioned at a vertically downward region of the first electronic component 500.

According to an embodiment, the second electronic component 200 is inserted into the cavity 110*c* of the first thermally conductive structure and at least a portion of the second electronic component 200 is positioned at a vertically downward region of the first electronic component 500. When the first electronic component 500 is an application processor, a capacitor is connected with the application processor to reduce noise. The capacitor, which improves response properties and reduces noise by providing power supplied from a separate power source portion (not shown) to electronic components, is called as a decoupling capacitor or a bypass capacitor. A shorter distance between the capacitor and the application processor, the greater a reduction in noise from the capacitor occurs.

Therefore, at least a portion of the second electronic component 200 is positioned at a vertically downward region from the first electronic component 500 to reduce noise.

In an embodiment, most of the first thermally conductive structure 110 is positioned at a vertically downward region from the first electronic component 500. An area of the upper surface of the first thermally conductive structure 110 is smaller than an area of the upper surface of the first electronic component 500. The area of the upper surface of the first thermally conductive structure 110 corresponds to a width of the hot spot of the first electronic component 500.

Thus, the heat from the hot spot rapidly moves to the first thermally conductive structure 110. It may be also advantageous to reduce warpage and weigh of the circuit board 100. Furthermore, efficiency to arrange the first thermally conductive structure 110 in the circuit board 100 is improved.

Most of the second electronic component 200 are positioned at a vertically downward region from the first electronic component 500. The second electronic component 200 is positioned inside the cavity 110*c* of the first thermally conductive structure 110, in the vertically downward region, from the first electronic component 500. The first thermally conductive structure 110 is positioned at a region closer to the hot spot, compared to the second electronic component 200.

Referring to FIG. 1 through FIG. 5, the first thermally conductive structures 110 and the second electronic components 200 are inserted inside cavities of a first core layer 11. The first cavity C1 and the second cavity C2 are formed in the core 10. The first thermally conductive structure 110 is inserted in the first cavity C1 and the second electronic component 200 is inserted in the second cavity C2. The second electronic component 200 is also inserted inside the cavity 110*c* of the first thermally conductive structure 110. For instance, the first thermally conductive structures 110 are arranged intensively around the hot spot as shown in FIG. 4.

Thus, the second electronic component 200 rapidly distributes the heat from the hot spot while optimally reducing noise. The first thermally conductive structures 110 and the second electronic components 200 are arranged to be adjacent each other at a vertically downward region of the first electronic component 500. For instance, the second electronic component 200 is arranged inside the cavity 110*c* of the first thermally conductive structure 110 to reduce noise and increase heat distribution in the circuit board 100, according to an embodiment.

When the second electronic component 200 is arranged inside the cavity 110*c* of the first thermally conductive structure 110, space needed for installation is reduced and a process to form cavities is further simplified, compared to a configuration in which the first thermally conductive structure 110 and the second electronic component 200 are configured to be spaced-apart. When more of the second electronic components 200 are needed, the second electronic components 200 are positioned or configured outside of the first thermally conductive structure 110. However, at least one of the second electronic components 200 is needed to be positioned inside the cavity 110*c* of the first thermally conductive structure 110 to provide above-mentioned effects.

Even though a configuration in which only one second electronic component 200 is inserted inside the cavity 110*c* of the first thermally conductive structure 110 is described and illustrated, a person skill in the art will appreciate that more than one second electronic component 200 may be inserted inside the cavity 110*c* of the first thermally conductive structure 110, based on a size of the first thermally conductive structure 110 and a size the second electronic component 200.

In an embodiment, the first electronic component 500 is operatively connected to the circuit board 100 using a solder S. The first electronic component 500 is combined with a first metal pattern 131, a third metal pattern 133, and a fifth metal pattern 134 using the solder S.

A second metal pattern 141, a fourth metal pattern 142, and a sixth metal pattern 144 of the circuit board 100 are operatively connected to the additive substrate 800, such as a main board, by the solder S. In an embodiment, a third thermally conductive structure L1, which is formed of a similar material similar and with a similar shape as the first thermally conductive structure 110, is formed, instead of the solder S, between the second metal pattern 141 and the additive substrate 800. Thus, the second metal pattern 141 and the additive substrate 800 are operatively connected using the third thermally conductive structure L1, which is made in a lump shape and made of a material having a greater thermal conductivity than a general solder S. As a result, heat is rapidly transferred from the first thermally conductive structure 110 to the additive substrate 800. A heat sink L2 is further formed in the additive substrate 800 to distribute or spread heat from the third thermally conductive structure L1. The heat sink L2 is exposed to the upper surface of the additive substrate 800. The heat sink L2 may be also exposed to the lower surface of the additive substrate 800 to improve heat distribution.

Accordingly, the heat transfers rapidly from the hot spot to the additive substrate 800 through a path including: the first metal pattern 131—the first via V1—the first thermally conductive structure 110—the second via V2—the second metal pattern 141.

When the first metal pattern 131 to the sixth metal pattern 144 are exposed to the external surface of the insulating part 120 as shown in FIG. 1, the metal patterns function as contact pads. A portion of the metal patterns is exposed and a solder resist layer is formed to protect the other portion of the metal pattern and the insulating part 120. Various surface treatment layers, such as a nickel-gold plating layer, are further formed on the surface of the metal pattern exposed to the external portion of the solder resist layer.

When a terminal, which is connected to the first metal pattern 131, is a terminal to transmit and receive signals among terminals of the first electronic component 500, the path including the first via V1, the first thermally conductive structure 110, the second via V2, and the second metal pattern 141 functions as a signal transmission path. In one example, a contact pad or a terminal of the additive substrate 800, which is connected to the second metal pattern 141, may also function as a signal transmission path.

On the other hand, when a terminal connected to the first metal pattern 131 does not transmit and receive signals among terminals of the first electronic component 500, the path including the first via V1, the first thermally conductive structure 110, the second via V2, and the second metal pattern 141 is electrically connected to a ground terminal. In one example, a contact pad or a terminal of the additive substrate 800, which is connected to the second metal pattern 141, is also electrically connected to the ground terminal. The ground terminal is mounted in at least one of the circuit board 100 and the additive substrate 800.

When a terminal that is connected to the first metal pattern 131 is a power terminal of the first electronic component 500, the path including the first via V1, the first thermally conductive structure 110, the second via V2, and the second metal pattern 141 is electrically connected to a power supply circuit. In one embodiment, a contact pad or a terminal of the additive substrate 800, which is connected to the second metal pattern 141, is also electrically connected to the power supply circuit. The power supply circuit is mounted in at least one of the circuit board 100 and the additive substrate 800.

A terminal of the first electronic component 500 that is connected to the first metal pattern 131 may be a dummy terminal. This dummy terminal only functions as a path to transfer heat from the first electronic component 500 to the outside of the first electronic component 500.

Referring to FIG. 1 through FIG. 10, the circuit board 100, according to an embodiment, includes the core part 10. The core part 10 reinforces a rigidity of the circuit board 100 to alleviate problems caused by warpage. The core part 10 includes a material having high thermal conductivity to rapidly distribute heat generated from a localized region, such as the hot spot, to other portions of the circuit board 100 to alleviate overheating.

A first upper insulation layer 121 is formed on the upper surface of the core part 10 and a first lower insulation layer 121' is formed on the lower surface of the core part 10. A second upper insulation layer 122 and a second lower insulation layer 122' may be also formed.

In an embodiment, the core part 10 includes a second thermally conductive structure. For example, the core part 10 includes a first core layer 11, which is composed of graphite or graphene. In one example, the graphite has a very high thermal conductivity in a XY plane direction to distribute heat efficiently and rapidly.

In an embodiment, the second thermally conductive structure is directly in contact with the surface of the first thermally conductive structure 110. For example, the side surface of the second thermally conductive structure is exposed to the first cavity C1 in the core part 10 and the first thermally conductive structure 110 is in contact with the first cavity C1. In another embodiment, a material with high thermal conductivity may be used in a region between the second thermally conductive structure and thermally conductive structure 110. In one example, the material with high thermal conductivity is a thermal interface material (TIM). The TIM includes a polymer-metal composite material, a ceramic composite material and a carbon-based composite material. Examples of the TIM include a mixed material of an epoxy and a carbon fiber filler (thermal conductivity about 660 W/mk), silicon nitride ($Si_3N_4$, thermal conductivity about 200~320 W/mk), and epoxy and boron nitride; (BN, thermal conductivity about 19 W/mk). Thus, the heat transferred to the first thermally conductive structure 110 is rapidly distributed to a vertical direction and a horizontal direction through the second thermally conductive structure.

When the first thermally conductive structure 110 and the second thermally conductive structure are directly in contact each other or are connected through the TIM, heat rapidly disperses, compared to when the heat is transferred only downward, after the heat is transferred from the first electronic component 500 to the first thermally conductive structure 110. In addition, as heat is evenly distributed throughout the circuit board 100, temperature variation of each of components and elements mounted on the circuit board 100 us reduced to improve reliability, compared to a case where temperature increases excessively at a certain region, such as a hot spot on the circuit board 100. Furthermore, as heat is rapidly distributed throughout the circuit board 100, the circuit board 100 functions as a heat sink to increase a radiant heat area.

In an embodiment, a first circuit pattern P1 and a second circuit pattern P2 are formed on the surface of the core part 10. The first circuit pattern P1 and the second circuit pattern P2 are electrically connected using through-vias TV, which pass through the core part 10. The first circuit pattern P1 may be connected with the third metal pattern 133 through the fourth via V4, and the second circuit pattern P2 may be connected with the fourth metal pattern 142 through the fifth via V5. The third metal pattern 133 may be connected with the first electronic component 500 through the solder S, and the fourth metal pattern 142 is connected with the contact pad 810 of the additive substrate 800, through the solder S. Thus, a path is provided to transmit and receive electrical signals between the first electronic component 500 and the additive substrate 800.

A second core layer 12 is formed on one surface of the first core layer 11 and a third core layer 13 is formed on the other surface of the first core layer 11. In an embodiment, at least one of the second core layer 12 and the third core layer 13 is an insulating material, such as PPG. In another embodiment, the second core layer 12 and the third core layer 13 are made of a metal, such as copper or invar. In another embodiment, the first core layer 11 is made of invar and the second core layer 12 and the third core layer 13 are made of copper. In one example, when at least one of the second core layer 12 and the third core layer 13 is composed of a conductive material, because signals may be transmitted to an unintended path due to the first circuit pattern P1 or the second circuit pattern P2 formed on the surface of the core 10, any portion of the second core layer 12 or the third core layer 13 may be formed on the surface of the core part 10 in order to ensure the dielectric property.

In an embodiment, the second electronic component 200 is inserted into the cavity 110c of the first thermally conductive structure 110. The second electronic component 200 is connected with the fifth metal pattern 134 through a sixth via V6 and also connected with the sixth metal pattern 144 through a seventh via V7. The second electronic component 200 is a passive element, such as an inductor, a capacitor, or other electrical element. The second electronic component 200 is an active element such as an IC (integrated circuit). When the second electronic component 200 is a capacitor, a terminal of the first electronic component 500 connected to the fifth metal pattern 134 is a power terminal. That is, the second electronic component 200 is mounted as a decoupling capacitor to reduce power noise of the first electronic component 500.

The shorter distance between the second electronic component 200 and the first electronic component 500, a greater decrease in noise. Thus, at least a portion of the second electronic component 200 is arranged at a vertically downward region from the first electronic component 500 in the circuit board 100, according to an embodiment.

Although not shown, a cave-in recess portion may be formed instead of the cavity that passes through the core part 10. Also, the first thermally conductive structure 110, or the second electronic component 200 may be inserted into the recess portion.

Referring to FIG. 1, a thickness of the first thermally conductive structure 110 is thicker than a thickness from a lower surface of the second circuit pattern P2 to the upper surface of the first circuit pattern P1. The upper surface of the first thermally conductive structure 110 is positioned closer to the upper surface of the circuit board 100 than the upper surface of the first circuit pattern P1. Thus, a heat capacity of the first thermally conductive structure 110 is increased to absorb more heat. Furthermore, a distance between the thermally conductive structure 110 and the hot spot is reduced to shorten the heat transfer time from the hot spot to the first thermally conductive structure 110.

FIG. 2 is a sectional view schematically illustrating a circuit board, according to another embodiment. Referring to FIG. 2, the second upper insulation layer 122 is formed on the first upper insulation layer 121. In one example, height of the first via V1 or the second via V2, which is formed between the external surface of the circuit board 100 and the first thermally conductive structure 110, is shorter than that of a via V4' and a via V5', which connects between the external surface of the circuit board 100 and inner layer patterns P1' and P2', respectively, to increase both the heat capacity and the heat distribution of the first thermally conductive structure 110.

Figure 7:
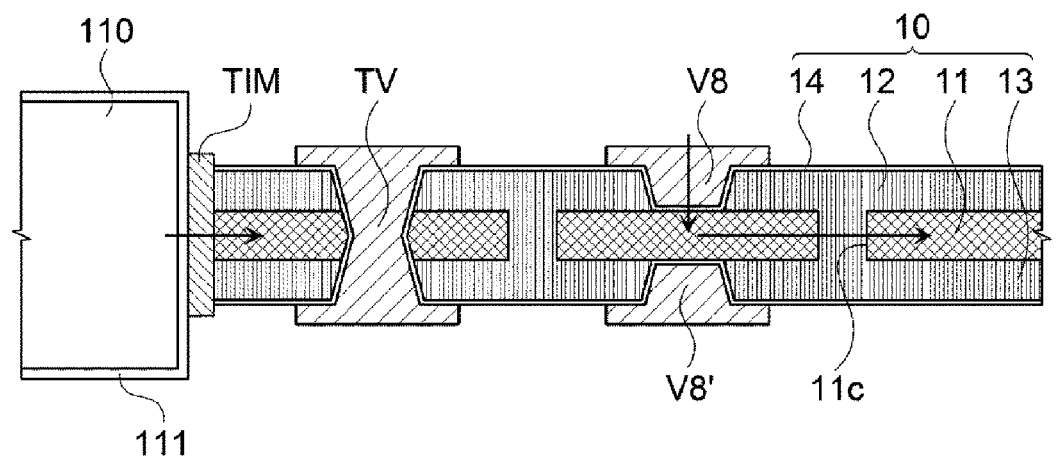
FIG. 7 is a sectional view schematically illustrating a portion of a circuit board, according to an embodiment.

FIG. 7 is a sectional view schematically illustrating a portion of a circuit board, according to an embodiment. Referring to FIG. 7, an insulating film 14 is formed on the surface of the core part 10. In an embodiment, the first core layer 11 to the third core layer 13 have thermal conductivity and electrical conductivity. Thus, when a first circuit pattern P1 is formed on the surface of the core part 10, current is transmitted to an unintended path by the core part 10. In one example, the insulating film 14 is formed by vapor depositing parylene on the surface of the core part 10. The through-via hole is formed in the core part 10 and an insulating material is then treated on the surface of the core part 10 to form the insulating film 14, even inside the through-via hole. Thus, dielectric properties are ensured to occur between the through-via TV, the first circuit pattern P1, or the second circuit pattern P2 and the core part 10.

In an embodiment, a core via hole, which passes through the second core layer 12 and the third core layer 13 and exposes a portion of the first core layer 11, is formed. An eighth via V8 made of a conductive material is directly in contact with the first core layer 11. When the insulating film 14 is formed on the surface of the core part 10 in which the core via hole is formed, the insulating film 14 is formed on a surface of the exposed first core layer 11 so that the first core layer 11 and the eighth via V8 are in contact with each other with the insulating film 14 therebetween. When heat travels through the eighth via V8, which is directly or indirectly when the insulating film 14 is formed, in contact with the first core layer 11, heat is rapidly distributed in a horizontal direction to the circuit board 100 along the first core layer 11.

In an embodiment, when the second thermally conductive structure is composed of graphite or graphene, the graphite or the graphene provides low interlayer bonding. Thus, the second thermally conductive structure may be damaged during a manufacturing process of the circuit board 100. In an alternative, a low interlayer bonding may lead to reliability problems after the circuit board 100 is manufactured.

As shown in FIG. 7, a via hole 11c is formed in the first core layer 11 to integrate with the second core layer 12 and the third core layer 13 so that the first core layer 11 is firmly supported. Thus, even though the first core layer 11 is made of graphite or graphene, the interlayer bonding is reinforced.

Figure 8:
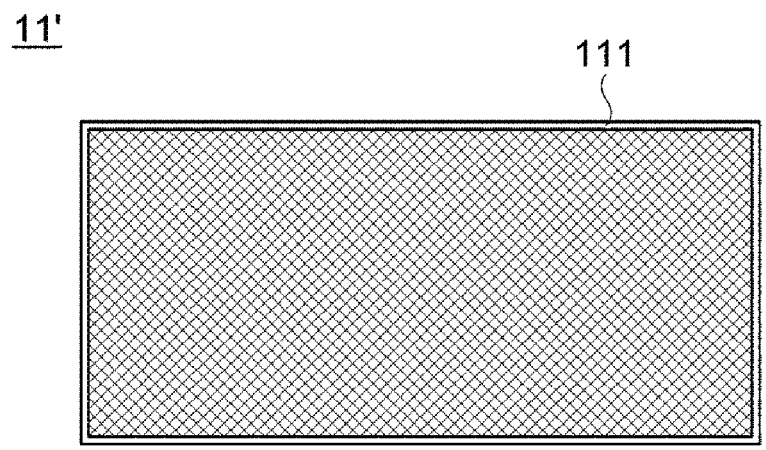
FIG. 8 illustrates a second thermally conductive structure, according to an embodiment.

FIG. 8 illustrates a second thermally conductive structure, according to an embodiment. Referring to FIG. 8, a primer layer 111 is formed on the external surface of the first core layer 11. That is, the primer layer 111 improves the interlayer bonding formed on the external surface of the graphite sheet. The primer layer 111 increases the interlayer bonding between graphites, increases the interlayer bonding between the first core layer 11 and the second core layer 12, and increases the interlayer bonding between the first core layer 11 and the third core layer 13.

Figure 9:
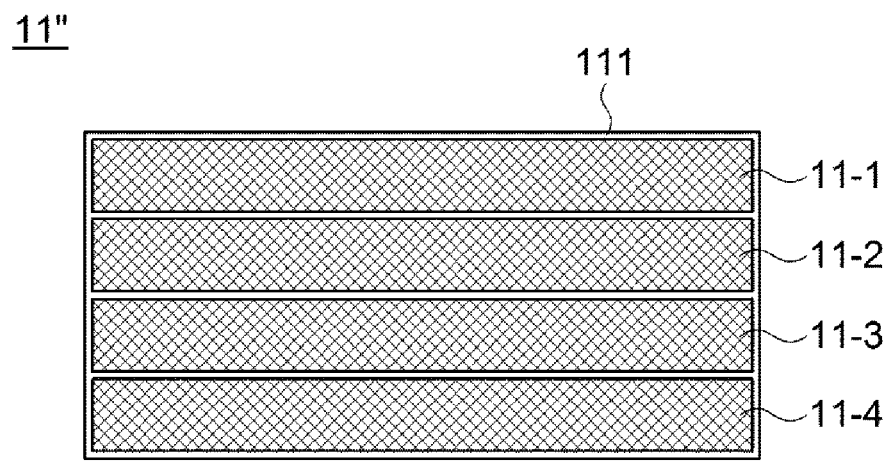
FIG. 9 illustrates a second thermally conductive structure, according to another embodiment.
Figure 10:
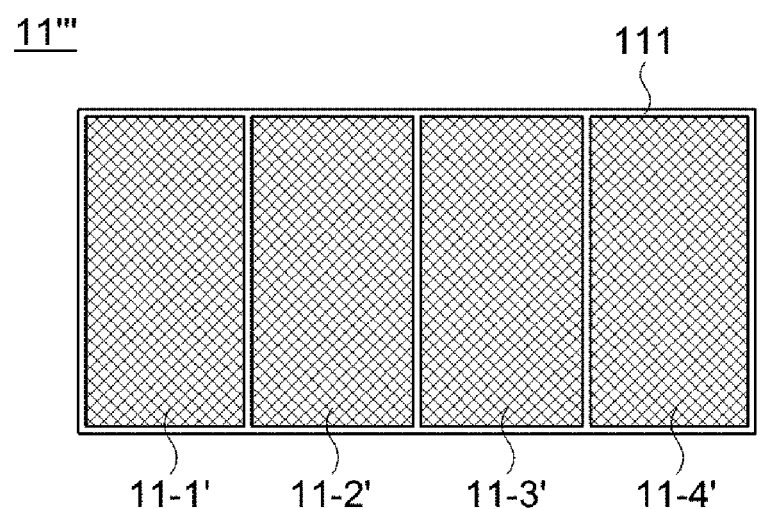
FIG. 10 illustrates a second thermally conductive structure, according to another embodiment.

In another embodiment, FIG. 9 illustrates a second thermally conductive structure, according to another embodiment. In FIG. 9, the first core layer 11" is formed by laminating unit layers 11-1, 11-2, 11-3, 11-4, on which the primer layer 111 is formed on the surface of the graphite, in a vertical direction. The configuration illustrated in FIG. 9 minimizes a reduction of horizontal heat distribution of the first core layer 11 and alleviates delamination in a vertical direction of the first core layer 11". FIG. 10 illustrates a second thermally conductive structure, in accordance with an embodiment. In FIG. 10, the first core layer 11''' is formed by laminating unit layers 11-1', 11-2', 11-3', 11-4', on which the primer layer 111 is formed on the surface of the graphite, in a horizontal direction. In one example, a XY plane of graphite is arranged to be parallel to the vertical direction. In this example, a reduction in heat distribution may occur in the horizontal direction, but the heat distribution may increase in the vertical direction using the first core layer 11'''.

A portion of the graphite may be provided to increase adhesion between the first thermally conductive structure 110 and the insulating part 120 in the circuit board 100, according to an embodiment.

When the surface of the first thermally conductive structure 110 is directly in contact with the insulating part 120, a gap may be formed between the first thermally conductive structure 110 and the insulating part 120 during the reflow process or the solder pot process, such phenomenon is called delamination. The primer layer 111 may be, thus, formed on the surface of the first thermally conductive structure 110 to improve the adhesion with the insulating part 120. In an embodiment, the primer layer 111 is made of a primer including isopropyl alcohol and acrylic silane. In one example, the primer layer 111 is composed of 3-(trimethoxysilyl) propylmethacrylate (MPS) or may further include a silane-based additive.

Figure 11A:
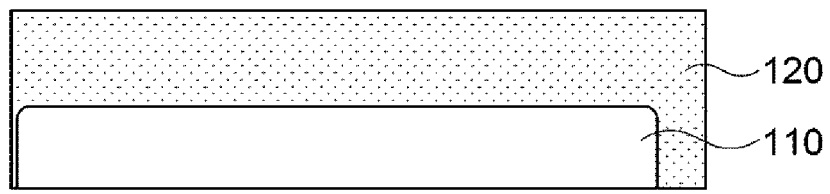
FIG. 11A is a schematic view illustrating a reflow test result of a primer layer formed on the surface of a thermally conductive structure, in accordance with an embodiment.
Figure 11B:
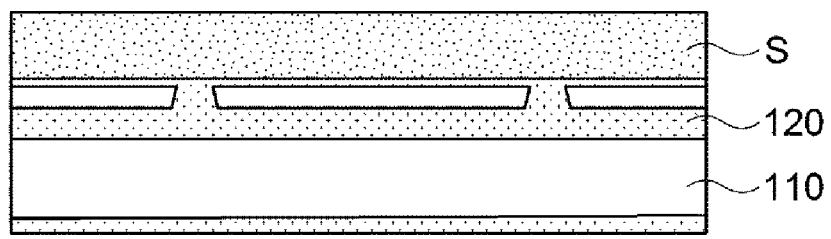
FIG. 11B is a schematic view illustrating a solder pot test result of a primer layer formed on the surface of a thermally conductive structure, in accordance with an embodiment.

FIG. 11A is a schematic view illustrating a reflow test result of a primer layer 111 formed on the surface of a thermally conductive structure, in accordance with an embodiment. FIG. 11B is a schematic view illustrating a solder pot test result of the primer layer 111 formed on the surface of a thermally conductive structure, in accordance with an embodiment. FIG. 12A is a schematic view illustrating a reflow test result of an insulating portion 120 directly contacted with a thermally conductive structure, in accordance with an embodiment, and FIG. 12B is a schematic view illustrating a solder pot test result of the insulating portion 120 directly contacted with a thermally conductive structure, in accordance with an embodiment.

Referring to FIG. 11A to FIG. 12B, an absence of a primer layer 111 may cause a gap D between the thermally conductive structure and the insulating part 120 during the reflow process or the solder pot process. However, when the primer layer 111 is formed on the surface of the thermally conductive structure, such configuration improves the adhesion between the thermally conductive structure and the insulating part 120. In one example, the thermally conductive structure is at least one of the first thermally conductive structure 110 and the second thermally conductive structure.

The adhesion between the first thermally conductive structure 110 and the insulating part 120 is improved by performing a surface treatment, such as blackening and roughening on the surface of the first thermally conductive structure 110.

Problems may occur during a manufacturing process when the surface of the first thermally conductive structure 110 is surface-treated. For example, a color of the first thermally conductive structure 110 may vary due to the surface treatment. In this case, an automated device, which forms the first thermally conductive structure 110 on the insulating part 120, may cause frequent errors in the process of recognizing the first thermally conductive structure 110.

Accordingly, the circuit board 100, according to an embodiment, reduces the delamination between the thermally conductive structure 110 and the insulating part 120.

Referring to back to FIG. 1, when the primer layer 111 is formed on the surface of the first thermally conductive structure 110, the first via V1 or the second via V2 may still be directly in contact with the first thermally conductive structure 110, through the primer layer 111. Thus, the primer layer 111 being formed on the surface of the first thermally conductive structure 110 minimizes reduction in heat distribution performance associated with the primer layer 111.

Figure 13:
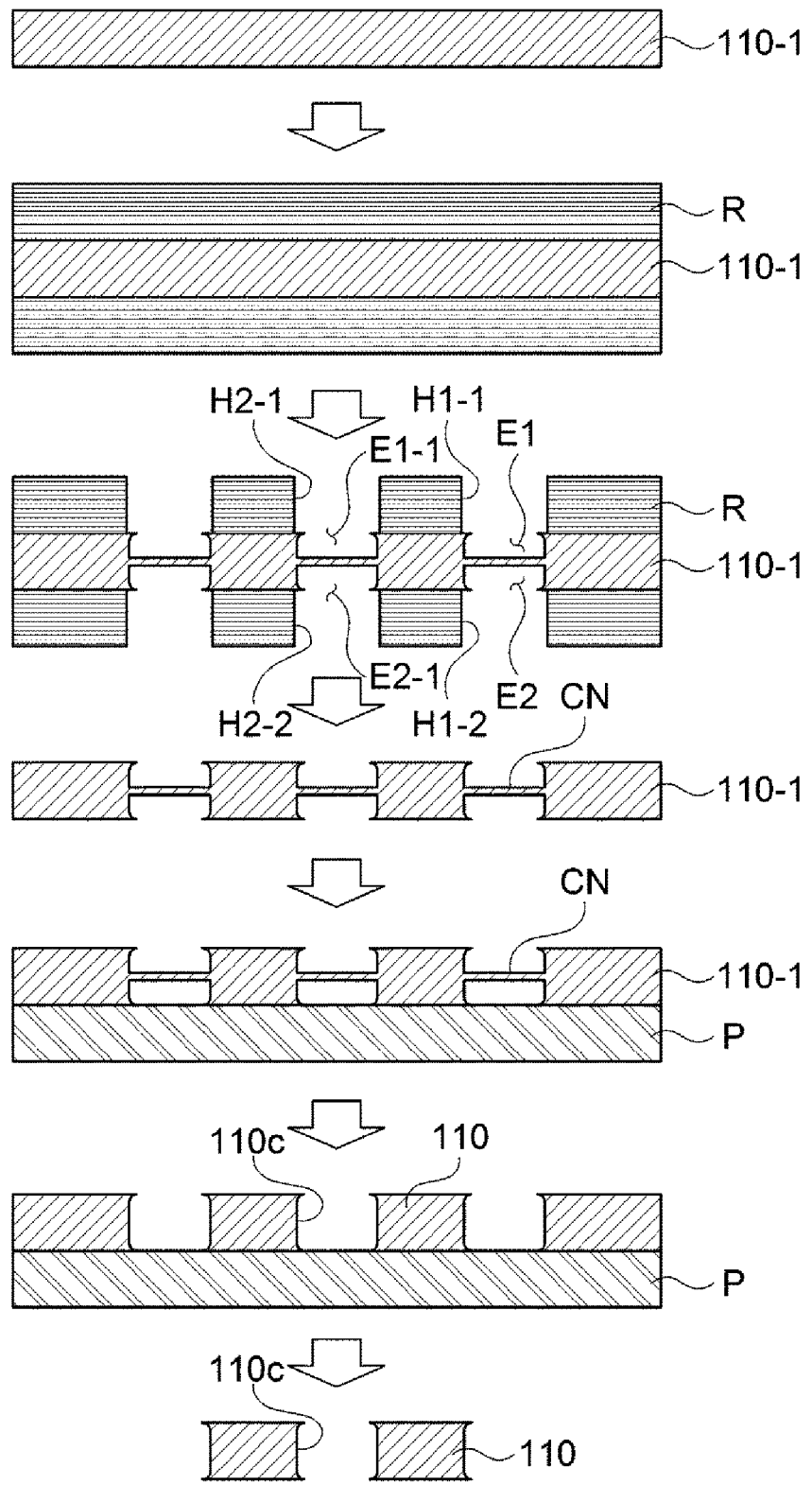
FIG. 13 illustrates a process for manufacturing a thermally conductive structure, according to an embodiment.

FIG. 13 illustrates a process for manufacturing a thermally conductive structure, according to an embodiment.

Referring to FIG. 13, a metal plate 110-1 made of a metallic material, such as Cu, is formed and a resist layer R is formed on the metal plate 110-1. Opening portions H1-1, H1-2, H2-1, H2-2 are formed by patterning the resist layer R to correspond to the shape of the first thermally conductive structure 110. Etching holes E1, E2, E1-1, E2-1 are formed through an etching process. In one example, when it is desired to form a plurality of first thermally conductive structures 110 using one metal plate 110-1, the etching process is performed until only connecting portions CN remain. The etched metal plate 110-1 is then placed on a separate plate P and the connecting portion CN is removed to provide the first thermally conductive structure 110. In one example, the etching holes E1-1, E2-1, which are formed from the opening portions H2-1, H2-2, become the cavity 110c of the first thermally conductive structure 110.

Figure 14:
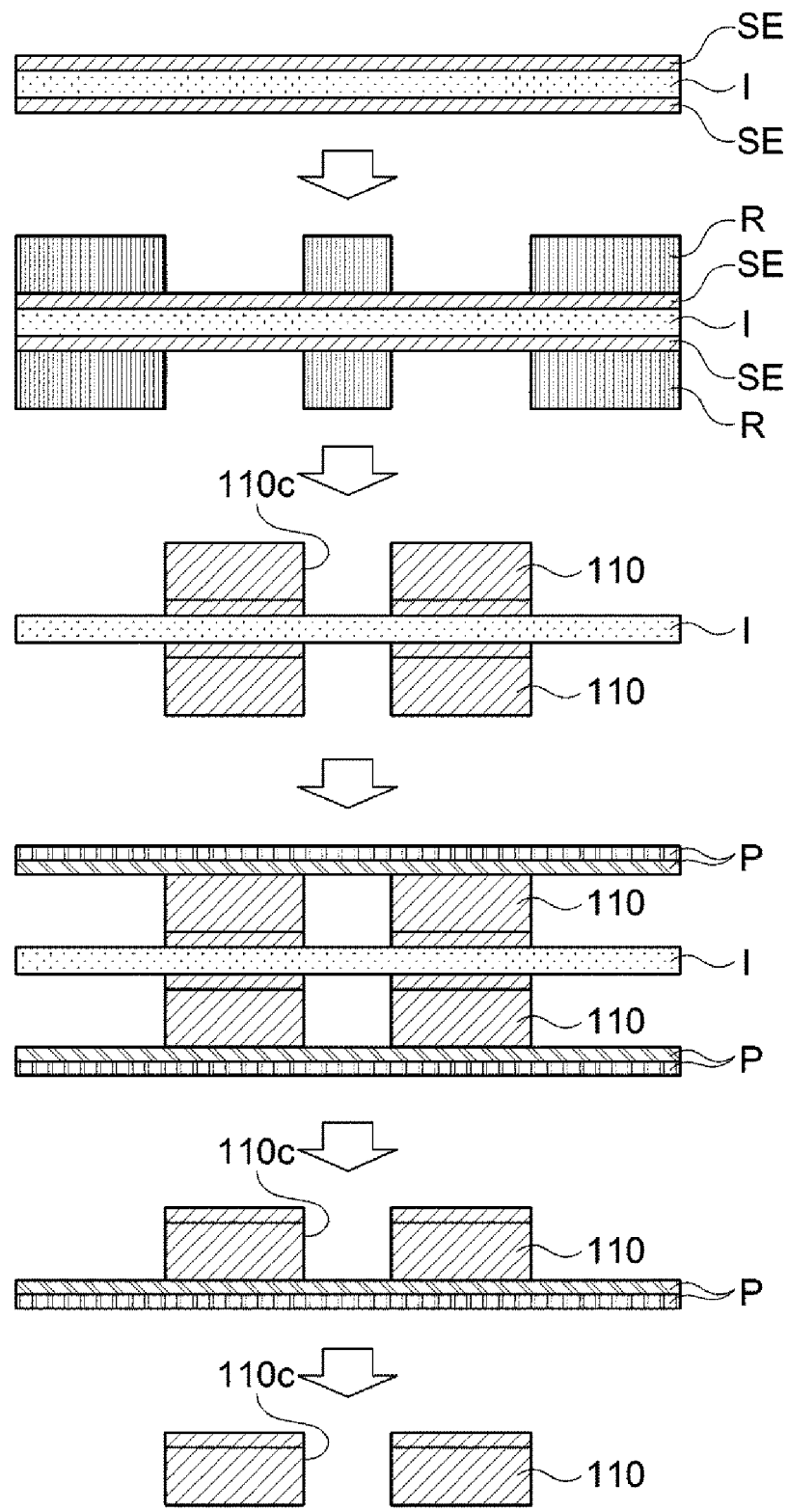
FIG. 14 illustrates a process for manufacturing a thermally conductive structure, according to another embodiment.

FIG. 14 illustrates a process for manufacturing the first thermally conductive structure 110, according to another embodiment.

Referring to FIG. 14, a resist layer R is formed on a seed layer SE and the resist layer R is patterned to open portions corresponding to the shape of the first thermally conductive structure 110. The first thermally conductive structure 110 is formed by coating multiple times and eliminating the resist layer R and the remained seed layer. Several to hundreds of multi-coatings are performed to increase a thickness of the first thermally conductive structure 110. When the multi-coating is performed, a layered structure is formed. In one example, I is a supporting part to support the seed layer SE and is a plate composed of a metal or non-metallic material.

According to an embodiment of FIG. 13, uniformity of the thickness of the first thermally conductive structure 110 is increased, while the side shape of the first thermally conductive structure 110 become relatively irregular. As a result, variation of height and width relatively increase. Therefore, the embodiments provide thickness control in a manufacturing of the first thermally conductive structure 110.

In contrast, according to an embodiment described in FIG. 14, uniformity of the width of the first thermally conductive structure 110 is improved, while thickness variation is relatively increased due to variations in the plating process. Therefore, the embodiments provide width control in a manufacturing of the first thermally conductive structure 110.

FIG. 15 illustrates a process for treating a core part 100, according to an embodiment.

Referring to FIG. 15, a via hole VH1 is formed in a core part including a first core layer 11, a second core layer 12 and a third core layer 13. An insulating film 14 is formed on the surface of the core part including the inner surface of the via hole VH1. A first circuit pattern P1, a through-via TV, and a second circuit pattern P2 are formed to ensure the dielectric property between the first circuit pattern P1 and the core part 10.

DESCRIPTION OF REFERENCE NUMERALS

100: Circuit board
110: First thermally conductive structure
111: Primer layer
120: Insulating part
121: First upper insulation layer
121': First lower insulation layer
122: Second upper insulation layer
122': Second lower insulation layer
131: First metal pattern 133: Third metal pattern
134: Fifth Metal pattern
141: Second metal pattern
142: Fourth Metal pattern
144: Sixth metal pattern
S: Solder
200: Second electronic component
V1: First via
V2: Second via
V4: Fourth via
V5: Fifth via
V6: Sixth via
V7: Seventh via
V8: Eighth via
10: Core part
11: First core layer
12: Second core layer
13: Third core layer
14: Insulating film
P1: First circuit pattern
P2: Second circuit pattern
TV: Through-via
500: First electronic component
800: Additive substrate
810: Contact pad
L1: Third thermally conductive structure
L2: Heat sink
C1: First cavity
C2: Second cavity While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A circuit board, comprising:
a first thermally conductive structure comprising
a cavity or a recess portion, wherein at least a portion of the first thermally conductive structure is inserted into an insulating part,
a first structure layer comprising a via hole, and
a second structure layer integrated on an upper surface of the first structure layer and a lower surface of the first structure layer by filling a material inside the via hole.

2. The circuit board of claim 1, wherein the first structure layer comprises invar and the second structure layer comprises copper.

3. The circuit board of claim 1, wherein the first structure layer comprises graphite or graphene.

4. A circuit board, comprising:
a first insulating layer comprising a first cavity;
a first thermally conductive structure comprising a second cavity, wherein a portion of the second cavity is inserted into the first cavity;
an electronic device comprising a portion inserted into the second cavity;
a second insulating layer covering an upper portion of the first insulating layer, the first thermally conductive structure, and the electronic device;
a third insulating layer covering a lower portion of the first insulating layer, the first thermally conductive structure, and the electronic device;
a first via comprising an end in contact with the first thermally conductive structure by passing through the second insulating layer;
a second via comprising an end in contact with the first thermally conductive structure by passing through the third insulating layer;
a third via comprising an end in contact with the electronic device by passing through the second insulating layer; and
a fourth via comprising an end in contact with the electronic device by passing through the third insulating layer.

5. The circuit board of claim 4, wherein a first electronic component is formed on an upper portion of the circuit board and at least a portion of the electronic device is positioned at a vertically downward region of the first electronic component.

6. The circuit board of claim 5, wherein the electronic device is a decoupling capacitor and the third via is operatively connected to a power source terminal of the first electronic component.

7. The circuit board of claim 5, wherein the first electronic component comprises a first region and a second region, wherein a temperature in the second region is higher than a temperature of the first region during an operation of the first electronic component, and
wherein a metal pattern is in contact with a joining portion, which is in contact with at least a portion of the second region, and is in contact with another end of the first via.

8. The circuit board of claim 4, further comprising:
a first metal pattern in contact with another end of the first via; and
a second metal pattern in contact with another end of the third via,
wherein heat flowing through the first metal pattern is greater than heat flowing through the second metal pattern.

9. The circuit board of claim 8, wherein a first electronic component is mounted on an upper portion of the circuit board,
wherein the first electronic component comprises a first region and a second region,
wherein a temperature of the second region increases more than a temperature of the first region during an operation of the first electronic component, and
wherein at least a portion of the second region is connected with the first metal pattern using a joining portion.

10. The circuit board of claim 4 wherein a first electronic component is mounted on an upper portion of the circuit board, and at least a portion of the first thermally conductive structure is positioned at a vertically downward region from the first electronic component.

11. The circuit board of claim 4, further comprising:
an adhesion improving portion formed on a surface of the first thermally conductive structure configured to increase adhesion between the first thermally conductive structure and at least one of the first insulating layer, the second insulating layer, and the third insulating layer.

12. The circuit board of claim 11, wherein the adhesion improving portion comprises a primer comprising acrylic silane.

13. The circuit board of claim 4, wherein the first thermally conductive structure comprises a hexahedron form with the upper surface and the lower surface thereof.

14. The circuit board of claim 4, further comprising:
a first metal pattern in contact with another end of the first via;
a second metal pattern in contact with another end of the second via;
a third metal pattern in contact with another end of the third via; and
a fourth metal pattern in contact with another end of the fourth via.

15. The circuit board of claim 14, wherein a first joining portion is in contact with the first metal pattern, and a first electronic component is in contact with the first joining portion.

16. The circuit board of claim 15, wherein a second joining portion is in contact with the second metal pattern, and an additive substrate is in contact with the second joining portion, and
wherein heat generated from the first electronic component is transmitted to the additive substrate through the first joining portion, the first metal pattern, the first via, the first thermally conductive structure, the second via, the second metal pattern, and the second joining portion.

17. The circuit board of claim 16, wherein the second joining portion is operatively connected on an upper surface of a heat sink, wherein the upper surface and a lower surface of the heat sink are exposed through the additive substrate, and wherein the additive substrate comprises a thermally conductive material.

18. The circuit board of claim 16, wherein the first electronic component comprises a first region and a second region of which clock speed is greater than that of the first region,
wherein a distance from the second region to the first joining portion is shorter than that from the first region to the first joining portion.

* * * * *